(12) United States Patent
Sasaki et al.

(10) Patent No.: US 7,415,250 B2
(45) Date of Patent: Aug. 19, 2008

(54) DISTORTION COMPENSATING AMPLIFIER

(75) Inventors: Takao Sasaki, Kawasaki (JP); Hideharu Shako, Kawasaki (JP); Hiromi Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1005 days.

(21) Appl. No.: 10/827,081

(22) Filed: Apr. 19, 2004

(65) Prior Publication Data

US 2005/0101254 A1 May 12, 2005

(30) Foreign Application Priority Data

Nov. 7, 2003 (JP) ............................. 2003-377853

(51) Int. Cl.
 *H04B 1/04* (2006.01)
(52) U.S. Cl. .............. 455/114.2; 455/114.3; 455/115.1; 455/67.11; 455/67.13; 375/296; 375/297
(58) Field of Classification Search .............. 455/114.2, 455/114.3, 115.1, 67.11, 67.13; 375/296, 375/297
See application file for complete search history.

(56) References Cited

U.S. PATENT DOCUMENTS 5,990,738 A * 11/1999 Wright et al. ............... 330/149

6,614,854 B1 * 9/2003 Chow et al. ................ 375/297
2005/0047521 A1 * 3/2005 Ishikawa et al. ............ 375/296

FOREIGN PATENT DOCUMENTS

| JP | 7-15718 | 1/1995 |
|---|---|---|
| JP | 7-170203 | 7/1995 |
| JP | 2001-203539 | 7/2001 |
| JP | 2003-8360 | 1/2003 |

* cited by examiner

*Primary Examiner*—Sanh D Phu
(74) *Attorney, Agent, or Firm*—Katten Muchin Rosenman LLP

(57) ABSTRACT

Disclosed is a distortion compensating amplifier having a distortion compensator for compensating for distortion of an amplifier by updating distortion compensation coefficients so as to null a difference between a transmit signal and a feedback signal, and subjecting the transmit signal to distortion compensation processing using the distortion compensation coefficients, an amplifier for amplifying the transmit signal, which has undergone distortion compensation, in order to transmit the signal from an antenna, and a feedback unit for inputting an output signal from the amplifier to a distortion compensation coefficient updater in the distortion compensator as the feedback signal. Whether the level of an unwanted-wave signal that penetrates the amplifier from space via an antenna is greater than a set level is monitored. If the level of the unwanted-wave signal is above the set level, processing for updating distortion compensation coefficients is suspended. If the level of the unwanted-wave signal is below the set level, then processing for updating distortion compensation coefficients is resumed.

3 Claims, 13 Drawing Sheets

FIG. 6
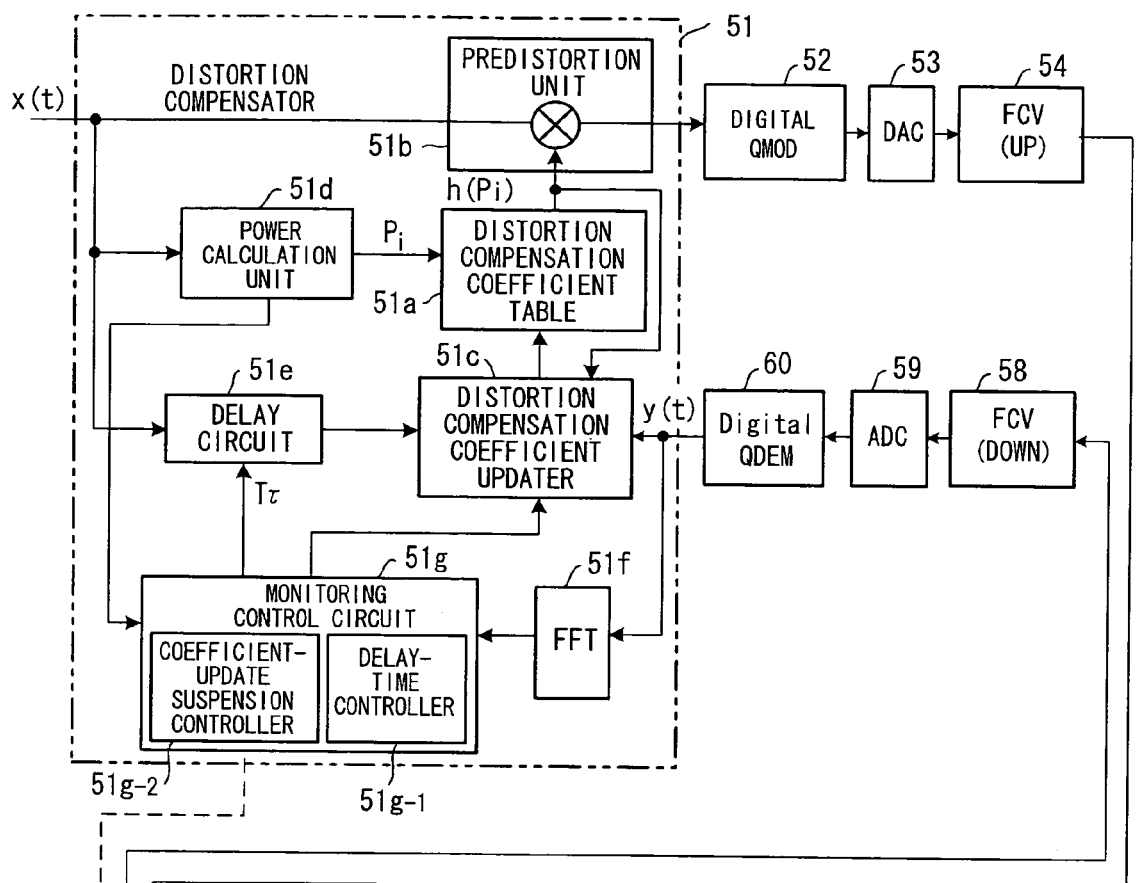
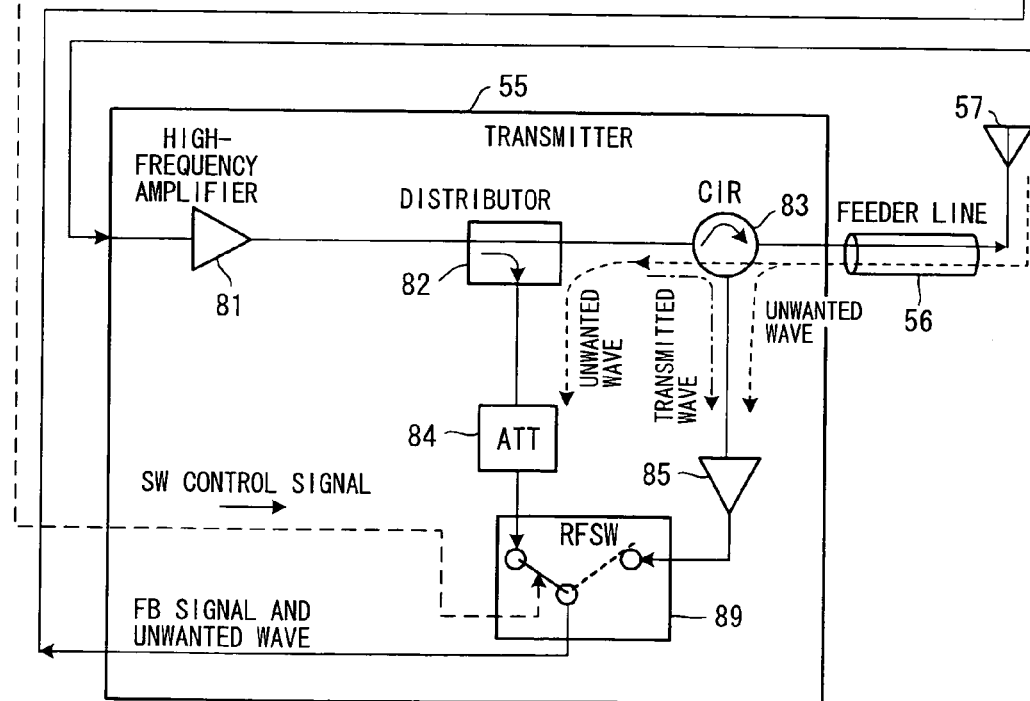

FIG. 9
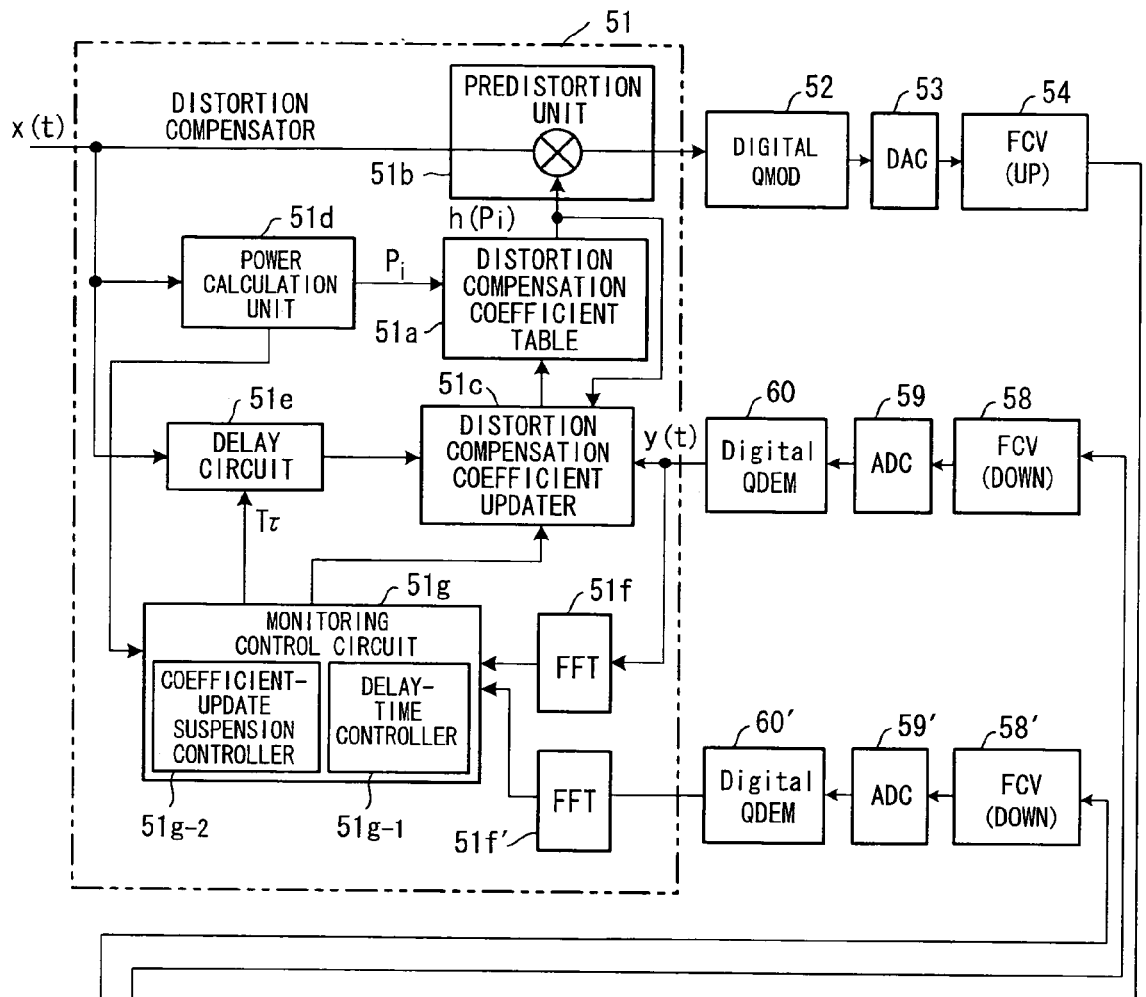
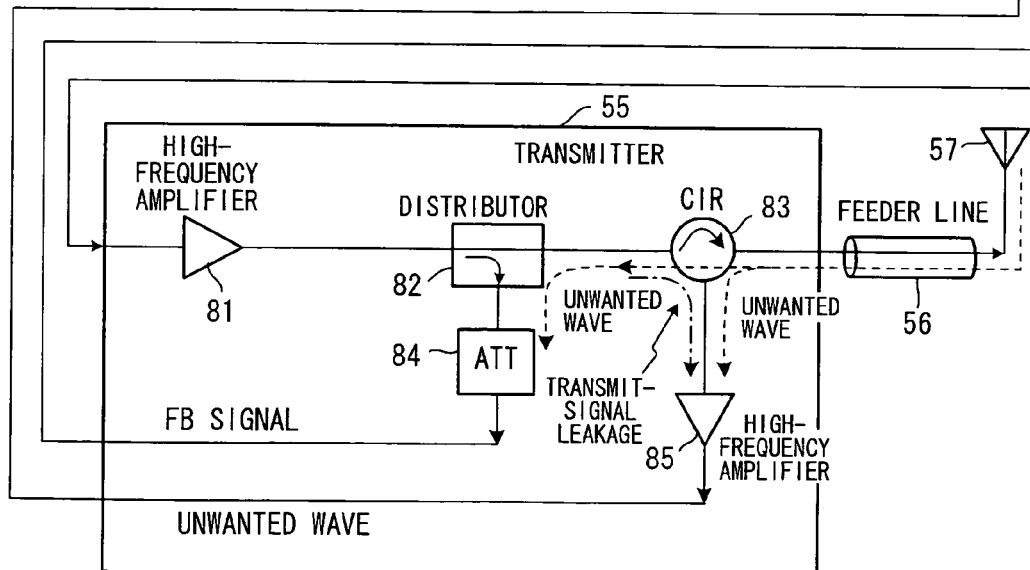

FIG. 13 PRIOR ART
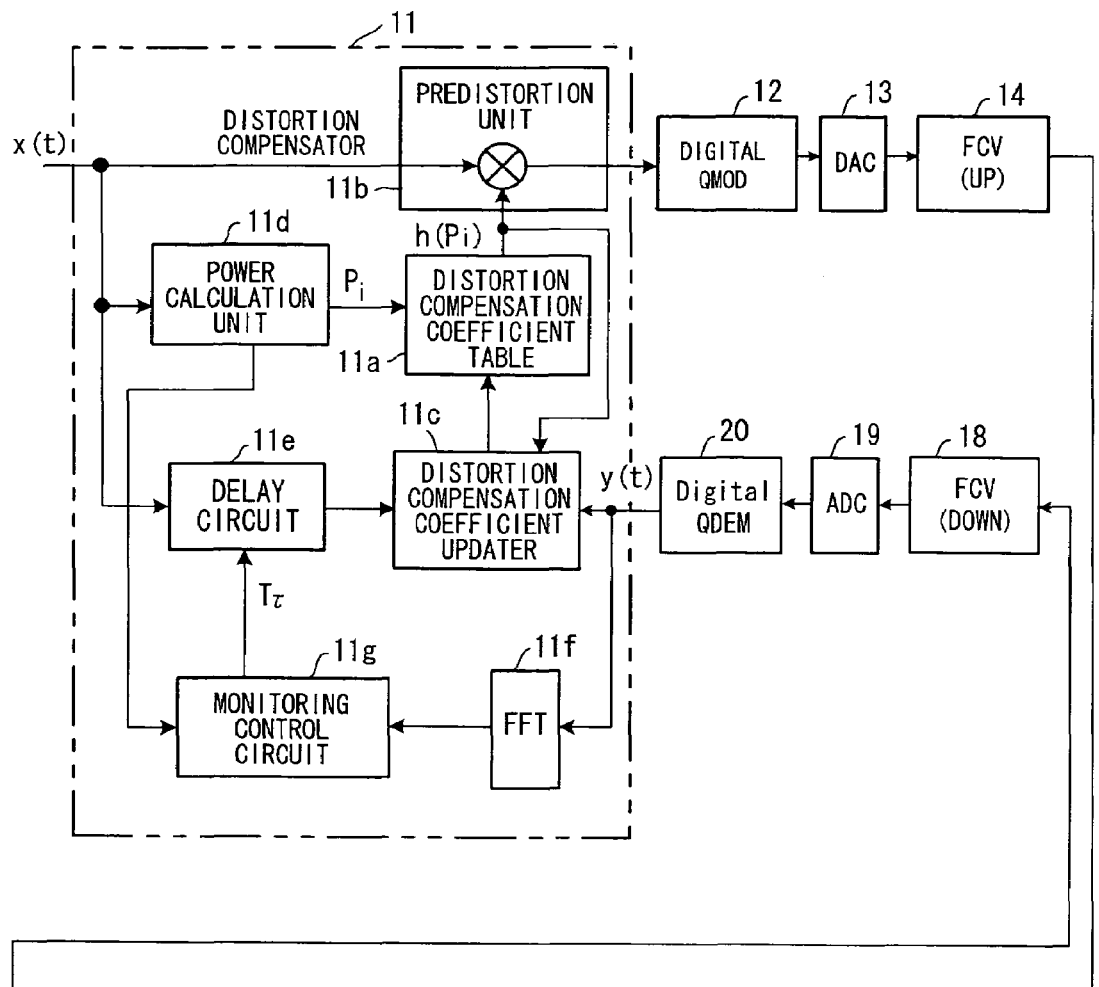
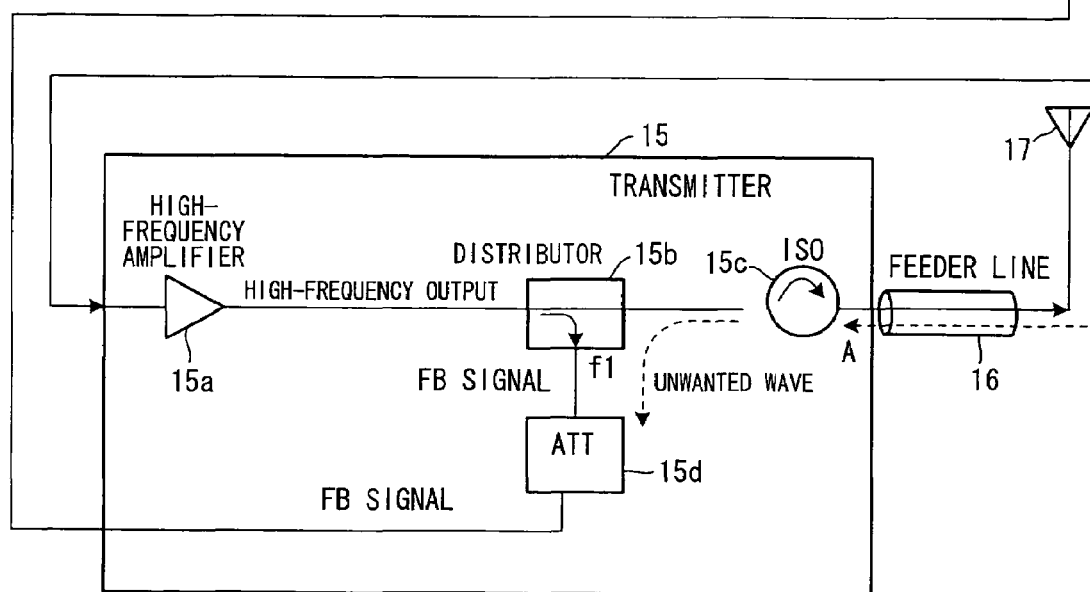

DISTORTION COMPENSATING AMPLIFIER

BACKGROUND OF THE INVENTION

This invention relates to a distortion compensating amplifier and, more particularly, to a distortion compensating amplifier for monitoring input of undesired waves from an antenna and exercising control so as to halt updating of a distortion compensation table in accordance with the level of an undesired-wave input, thereby improving the distortion compensation characteristic at the time of an undesired-wave input.

In wireless communications in recent years, there is growing use of high-efficiency transmission using digital techniques. In instances where multilevel phase modulation is applied to wireless communications, a vital technique is one which can suppress non-linear distortion by linearizing the amplification characteristic of the power amplifier on the transmitting side and reduce the leakage of power between adjacent channels. Also essential is a technique which compensates for the occurrence of distortion that arises when an attempt is made to improve power efficiency by using an amplifier that exhibits poor linearity.

FIG. 10 is a block diagram illustrating an example of a transmitting apparatus in a radio according to the prior art. Here a transmit-signal generator 1 transmits a serial digital data sequence and a serial/parallel (S/P) converter 2 splits the digital data sequence alternately one bit at a time to convert the data to two sequences, namely an in-phase component signal (also referred to as an "I signal") and a quadrature component signal (also referred to as a "Q signal"). A DA converter 3 converts the I and Q signals to respective analog baseband signals and inputs these to a quadrature modulator 4. The latter multiplies the input I and Q signals (the transmit baseband signals) by a reference carrier wave and a signal that has been phase-shifted relative to the reference carrier by 90°, respectively, and adds the results of multiplication to thereby perform quadrature modulation and output the modulated signal. A frequency converter 5 mixes the quadrature-modulated signal and a local oscillation signal to thereby effect a frequency conversion, and a transmission power amplifier 6 power-amplifies the carrier output from the frequency converter 5. The amplified signal is released into space from an antenna 7.

In mobile communications based upon W-CDMA, etc., the transmission power of the transmitting apparatus is a high ten watts to several tens of watts, and the input/output characteristic [distortion function f(p)] of the transmission power amplifier 6 is non-linear, as indicated by the dotted line in FIG. 11A. Non-linear distortion arises as a result of this non-linear characteristic, and the frequency spectrum in the vicinity of a transmission frequency $f_0$ comes to exhibit a characteristic having side lobes, as indicated by the solid line SA in FIG. 11B, instead of the ideal characteristic indicated by the dotted line SI in FIG. 11B, leakage into adjacent channels occurs and this causes interference between adjacent channels. More specifically, owing to non-linear distortion, there is an increase in power that causes transmitted waves to leak into the adjacent frequency channels, as shown in FIG. 11B. ACPR (Adjacent Channel Power Ratio), which indicates the magnitude of leakage power, is the ratio between the power of the channel of interest, which is the area of the spectrum between the one-dot chain lines A and A' in FIG. 11B, and the adjacent leakage power, which is the area of the spectrum between the two-dot chain lines B and B', that leaks into the adjacent channel. Such leakage power constitutes noise in other channels and degrades the quality of communication of these channels. Such leakage must be limited to the utmost degree.

The foregoing relates to a case in which the transmitted wave is a single wave. In a situation where a signal is transmitted by a plurality of waves, e.g., four waves, the frequency spectrum in the vicinity of the center frequency f1 of the transmit signal is such that side lobes (distortion components) SL develop, as illustrated in FIG. 12A, signal leakage into adjacent channels occurs and interference occurs between channels.

Ideally, therefore, it must be so arranged that the characteristic becomes as indicated by the dotted line SI in FIG. 11B in case of a single wave and as indicated in FIG. 12B, i.e., a characteristic without side lobes, in case of four waves.

Leakage power is small in the linear region [see FIG. 11A] of a power amplifier and large in the non-linear region. Accordingly, it is necessary to broaden the linear region in order to obtain a transmission power amplifier having a high output. However, this necessitates an amplifier having a performance higher than that actually needed and therefore is inconvenient in terms of cost and apparatus size. Accordingly, a transmission apparatus that has come to be adopted is equipped with a distortion compensating function that compensates for distortion ascribable to non-linearity of the power amplifier.

FIG. 13 is a block diagram illustrating a conventional distortion compensating amplifier having a digital distortion compensating function (see the specifications of JP2003-8360A, JP2001-203539A, by way of example). A transmit signal x(t) is input to a distortion compensator 11 in the form of, e.g., I, Q orthogonal signals (baseband). The distortion compensator 11 includes a distortion compensation coefficient memory 11a (a distortion coefficient compensation table) for storing distortion compensation coefficients h(pi) (i=0~1023) conforming to power levels pi of the transmit signal x(t); a predistortion unit 11b for subjecting the transmit signal to distortion compensation processing (predistortion) using a distortion compensation coefficient h(pi) that is in conformity with the power level of the transmit signal; a distortion compensation coefficient updater 11c for comparing the transmit signal x(t) with a demodulated signal (feedback signal) y(t), which has been obtained by demodulation in an orthogonal detector described later, and for calculating and updating the distortion compensation coefficient h(pi) in such a manner that the difference between the compared signals will diminish, e.g., approach zero; a power calculation unit 11d for calculating the power of the transmit signal; a delay circuit 11e set to a delay time Tτ, which extends from the moment the transmit signal x(t) is input to the distortion compensator 11 to the moment the feedback signal y(t) is input to the distortion compensation coefficient calculation unit 11c, for delaying the transmit signal x(t) by this delay time; an FFT (Fast-Fourier Transform) unit 11f for outputting a distortion component, which is outside the transmit-signal frequency band, included in the feedback signal y(t); and a monitoring control circuit 11g for setting and adjusting the delay time Tτ based upon the power of the transmit signal and the power of the distortion component outside the frequency band.

The power calculation unit 11d of the distortion compensator 11 calculates the power of the entering transmit signal x(t), reads a distortion compensation coefficient h(pi) conforming to power pi (i=0 to 1023) out of the distortion compensation coefficient table 11a and inputs the coefficient to the predistortion unit 11b. The latter executes distortion compensation processing (predistortion) by multiplying the transmit signal x(t) by the distortion compensation coefficient h(pi) conforming to the power level of the transmit signal and outputs the resulting signal.

The signal (actually a complex signal) that has been subjected to distortion compensation processing by the distortion compensator 11 is input to a digital modulator (QMOD) 12. The latter applies digital quadrature modulation to the in-phase and quadrature components (I and Q signals) of the signal that has undergone distortion compensation processing, and a DA converter 13 converts the digital quadrature-modulated signal to an analog signal and inputs the analog signal to a frequency converter 14. The latter mixes the quadrature-modulated signal and a local oscillation signal, thereby up-converting the modulated-signal frequency to radio frequency. The radio-frequency signal is input to a high-frequency amplifier 15a of a transmitter 15.

The high-frequency amplifier 15a subjects the input signal to high-frequency amplification. The transmit signal that has undergone high-frequency amplification is input to an antenna 17 from a feeder line 16 via a distributor 15b and isolator 15c, and the signal is released into space from the antenna 17. Part of the transmit signal that is output from the high-frequency amplifier 15a is branched by the distributor 15b, which comprises a directional coupler, and is attenuated by an attenuator 15d and then fed back to a frequency converter 18. The latter down-converts the radio-frequency signal to a baseband signal and inputs this signal to an AD converter 19. The latter converts the baseband signal to digital data and inputs the digital data to a digital quadrature demodulator (QDEM) 20. The latter subjects the input signal to quadrature demodulation processing, reproduces the baseband signals on the transmitting side and inputs the result as the feedback signal y(t) to an error calculation unit (not shown) within the distortion compensation coefficient updater 11c. The latter compares the transmit signal x(t), which has been delayed by the delay circuit 11e, with the demodulated signal (feedback signal) y(t) obtained by demodulation in the digital quadrature demodulator (QDEM) 20, calculates distortion compensation coefficients h(pi) based upon an adaptive control algorithm so as to null the difference between the compared signals, and updates old coefficients in the distortion compensation coefficient table 11a by the calculated distortion compensation coefficients. In parallel with the above operation, the monitoring control circuit 11g calculates the ACPR from the power of the transmit signal and leakage power (the distortion-component power) that is outside the frequency band and adjusts the delay time Tτ based upon the ACPR calculated.

By subsequently repeating the above operation, non-linear distortion of the high-frequency amplifier 15a in transmitter 15 is suppressed to reduce leakage of power between adjacent channels, whereby the frequency spectrum becomes as illustrated in FIG. 12B.

FIG. 14 is a diagram useful in describing processing for updating distortion compensation coefficients by adaptive LMS (Least Mean Square). Components in FIG. 14 identical with those shown in FIG. 13 are designated by like reference characters. The power calculation unit 11d has a power measurement unit 21 for calculating power $p_n$ (=$|x|^2$) of the transmit signal x(t), reads a distortion compensation coefficient $h_n(p)$ that conforms to the power pn (n=0 to 1023) output of the distortion compensation coefficient table 11a and inputs the coefficient to the predistortion unit 11b. The latter performs distortion compensation processing (predistortion) by multiplying the transmit signal x(t) by the distortion compensation coefficient $h_n(p)$ that conforms to the power level of the transmit signal. The high-frequency amplifier 15a (FIG. 13) amplifies the distortion-compensated transmit signal x(t) and transmits it from the antenna. Part of the transmit signal amplified by the high-frequency amplifier is input to the distortion compensation coefficient updater 11c in the form of the feedback signal y(t).

The distortion compensation coefficient updater 11c includes a subtractor 31 that outputs the error e(t) between the transmit signal x(t), which has been delayed by the delay time Tτ, prior to the distortion compensation thereof and the feedback signal y(t); a multiplier 32 that performs multiplication between the error e(t) and a step-size parameter μ; a complex-conjugate signal output unit 33 for outputting a complex-conjugate signal y*(t); a multiplier 34 for multiplying the distortion compensation coefficient $h_n(p)$, which has been delayed by Tτ in a delay unit 37, by y*(t), thereby outputting u*(t); a multiplier 35 for multiplying μe(t) by u*(t); and an adder 36 for adding the distortion compensation coefficient $h_n(p)$ and μe(t)u*(t), thereby calculating a new distortion compensation coefficient $h_{n+1}(p)$ and inputting it to the distortion compensation coefficient table 11a. The latter updates the distortion compensation coefficient $h_n(p)$, which conforms to the transmit-signal power $|x|^2$ delayed by Tτ in a delay element 22 in the power calculation unit 11d, with the distortion compensation coefficient $h_{n+1}(p)$.

If the update control set forth above is described in terms of mathematical expressions, the calculations indicated below are performed.

$$h_{n+1}(p)=h_n(p)+\mu e(t)u^*(t)$$

$$e(t)=x(t)-y(t)$$

$$y(t)=h_n(p)x(t)f(p)$$

$$u(t)=x(t)f(p)=h_n(p)y^*(t)$$

$$p=|x(t)|^2$$

where x, y, f, h, u, e represent complex numbers and * signifies a complex conjugate. By executing the processing set forth above, the distortion compensation coefficient h(p) is updated so as to minimize the difference signal e(t) between the transmit signal x(t) and the feedback signal y(t), and the coefficient eventually converges to the optimum distortion compensation coefficient value so that compensation is made for the distortion in the transmission power amplifier.

The conventional distortion compensating amplifier described above gives no consideration whatsoever to a situation in which a signal from another service or a signal of another system enters from the antenna side and mixes in with the feedback signal y(t) (see the dashed arrow A in FIG. 13). A signal from another service or a signal of another system enters from the antenna side is an unwanted wave in distortion compensation control. A frequency spectrum of an unwanted wave W0 and transmit signals W1 to W4 of four waves is as shown in FIG. 15.

If an unwanted wave thus mixes in with the feedback signal, the proper error e(t) cannot be output and the distortion compensation characteristic deteriorates.

Further, the prior art monitors the distortion-component power (leakage power) outside the band indicated in FIG. 11B or FIG. 12B and adjusts the delay time Tτ in a delay circuit or the like so as to reduce the power of the distortion component. With the conventional method, however, an unwanted wave is regarded as distortion-component power, the distortion-component power cannot be detected correctly, an erroneous adjustment of delay time is made, the distortion compensation coefficient table shifts from the optimum values and the distortion compensation characteristic deteriorates.

SUMMARY OF THE INVENTION

Accordingly, an object of the present invention is to so arrange in that distortion compensation control can be carried out correctly even if a signal (an unwanted wave) from another service or from another system enters from the antenna side and mixes in with the feedback signal y(t).

Another object of the present invention is to so arrange it that a distortion compensation coefficient table can be prevented from shifting from optimum values even if a signal (an unwanted wave) from another service or from another system enters from the antenna side and mixes in with the feedback signal y(t), the end result being that the distortion compensation characteristic will not be degraded.

The present invention relates to a distortion compensating amplifier having a distortion compensator for compensating for distortion of an amplifier by updating distortion compensation coefficients so as to null a difference between a transmit signal and a feedback signal, and subjecting the transmit signal to distortion compensation processing using the distortion compensation coefficients; an amplifier for amplifying the transmit signal, which has undergone distortion compensation, in order to transmit the signal from an antenna; a feedback unit for inputting an output signal from the amplifier to a distortion compensation coefficient updater in the distortion compensator as the feedback signal; and a delay circuit for inputting the transmit signal to the distortion compensation coefficient updater upon delaying the transmit signal.

According to a first aspect of the present invention, the distortion compensating amplifier monitors whether the level of an unwanted-wave signal that penetrates the amplifier from space via an antenna is greater than a set level and suspends processing for updating distortion compensation coefficients if the level of the unwanted-wave signal is greater than the set level. Updating of a distortion compensation coefficient table is resumed after the unwanted wave vanishes.

According to a second aspect of the present invention, the distortion compensating amplifier detects an unwanted-wave signal that penetrates the amplifier from space via an antenna, subjects the detected level of the unwanted-wave signal to an analog-to-digital conversion and suspends processing for updating distortion compensation coefficients based upon the level of the unwanted-wave signal. That is, the distortion compensating amplifier suspends processing for updating distortion compensation coefficients when the level of the unwanted-wave signal is greater than a set level and changes the set level in accordance with the level of the transmit signal.

According to a third aspect of the present invention, the distortion compensating amplifier comprises means for detecting an unwanted-wave signal that penetrates the amplifier from space via an antenna; and update processing suspension means for suspending processing for updating distortion compensation coefficients when the detected level of the unwanted-wave signal is greater than a set level; wherein the feedback signal and the unwanted-wave signal are input selectively to the distortion compensation updater and update processing suspension means, and the distortion compensation updater executes processing to update the distortion compensation coefficients only when the feedback signal is being input thereto and, moreover, suspension of update processing has not been specified.

According to a fourth aspect of the present invention, the distortion compensating amplifier detects an unwanted-wave signal that penetrates the amplifier from space via an antenna and suspends processing for updating distortion compensation coefficients when a signal component included in the unwanted-wave signal and outside a frequency band of the transmit signal is greater than a set level. In parallel with the above operation, the distortion compensating amplifier extracts a signal component included in the feedback signal and outside the frequency band of the transmit signal and controls the delay time of the delay circuit based upon the level of this signal component.

In accordance with the distortion compensating amplifier of the first aspect of the invention, the distortion compensation coefficient table is not updated if an unwanted wave enters. As a result, the distortion compensation coefficient table can be prevented from being shifted from optimum values. Furthermore, since there is no change in conditions such as a sudden change in temperature, it is possible to perform correct distortion compensation even if the distortion compensation coefficient table is not updated for a comparatively long period of time. Further, in accordance with the distortion compensating amplifier of the first aspect of the invention, it can be so arranged that a threshold value is set for the period of time during which an unwanted wave is input, an alarm is output to alert a host device if input of the unwanted wave extends over a long period of time, and the host device is cause to take prescribed measures.

In accordance with the distortion compensating amplifier of the second aspect of the invention, an unwanted-wave threshold value for suspending updating of the distortion compensation coefficient table is changed in accordance with the level of the transmit signal. For example, signal power of a distortion component conforming to the power of the transmit signal is measured in advance and a signal having a level greater than the measured level to a certain extent is stored for every transmit-signal level as a threshold value for detecting unwanted waves. When an unwanted wave is detected, a threshold value corresponding to the transmission level is read out. If the threshold value is exceeded, it is determined that an unwanted wave has been detected and updating of the distortion compensation coefficients is suspended. If this arrangement is adopted, the threshold value will increase when the power of the transmit signal increases. This makes it possible to prevent the updating of distortion compensation coefficients from being suspended owing to a low unwanted-wave level when the transmission power is high.

In accordance with the distortion compensating amplifier of the third aspect of the invention, it is so arranged that the feedback signal and unwanted-wave signal are input to level detecting means selectively. As a result, the level of an unwanted wave can be detected accurately without being affected by the level of the transmit signal and control for suspending updating of the distortion compensation coefficient table can be performed correctly based upon the level of the unwanted wave.

In accordance with the distortion compensating amplifier of the fourth aspect of the invention, dedicated means for detecting the level of an unwanted-wave signal is provided. This makes it possible to detect the level of an unwanted wave accurately at all times and to perform control for suspending updating of the distortion compensation coefficient table correctly based upon the level of the unwanted wave.

Other features and advantages of the present invention will be apparent from the following description taken in conjunction with the accompanying drawings.

BRIEF DESCRIPTION OF THE DRAWINGS

FIG. 6 is a block diagram illustrating a distortion compensating amplifier according to a third embodiment having a digital distortion compensating function;

FIG. 9 is a block diagram illustrating a distortion compensating amplifier according to a fourth embodiment having a digital distortion compensating function;

FIG. 13 is a block diagram illustrating a conventional transmitting apparatus having a digital distortion compensating function;

DESCRIPTION OF THE PREFERRED EMBODIMENTS

(A) Overview of the Present Invention

A distortion compensating amplifier according to the present invention monitors whether the level of an unwanted-wave signal that penetrates the amplifier from space via an antenna is greater than a set level, suspends processing for updating distortion compensation coefficients if the level of the unwanted-wave signal is greater than the set level and resumes updating of a distortion compensation coefficient table after the unwanted wave vanishes. In accordance with the distortion compensating amplifier according to the present invention, the distortion compensation coefficient table is not updated if an unwanted wave enters. As a result, the distortion compensation coefficient table can be prevented from being shifted from optimum values.

(B) First Embodiment

Figure 1:
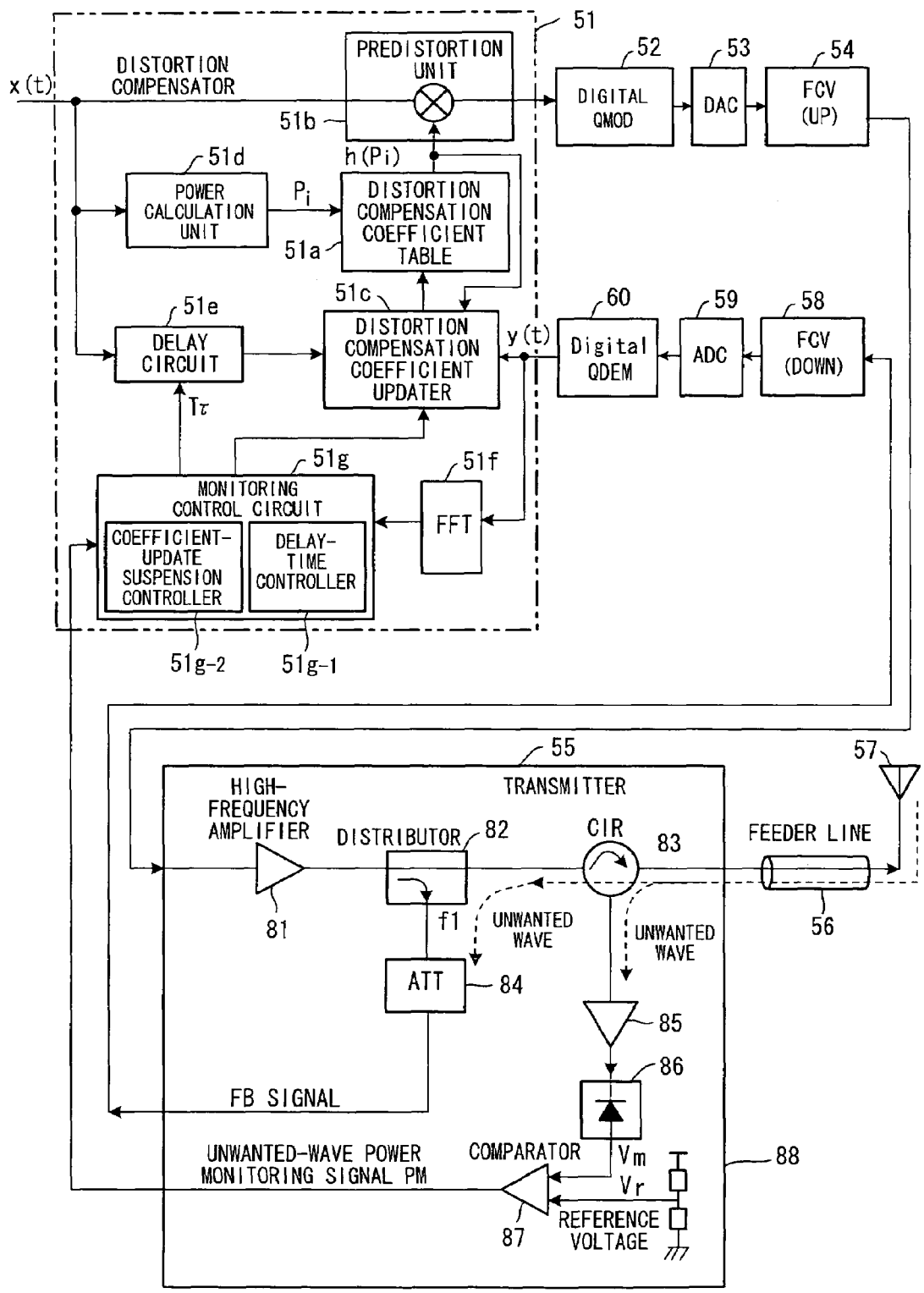
FIG. 1 is a block diagram illustrating a distortion compensating amplifier according to a first embodiment having a digital distortion compensating function.

FIG. 1 is a block diagram illustrating a distortion compensating amplifier according to a first embodiment having a digital distortion compensating function. The distortion compensating amplifier includes a distortion compensator 51, a distortion compensation coefficient memory (distortion compensation coefficient table) 51a, a predistortion unit 51b, a distortion compensation coefficient updater 51c, a power calculation unit 51d, a delay circuit 51e, an FFT (Fast-Fourier Transform) unit 51f and a monitoring control circuit 51g.

The distortion compensation coefficient table 51a stores distortion compensation coefficients h(pi) (i=0~1023) conforming to power levels pi of the transmit signal x(t), and the predistortion unit 51b subjects the transmit signal to distortion compensation processing using a distortion compensation coefficient h(pi) that is in conformity with the power level of the transmit signal. The distortion compensation coefficient updater 51c compares the transmit signal x(t) with a demodulated signal (feedback signal) y(t), which has been obtained by demodulation in a quadrature demodulator 60 described later, and calculates and updates the distortion compensation coefficient h(pi) in such a manner that the difference between the compared signals will diminish, e.g., approach zero. The power calculation unit 51d calculates the power pi of the transmit signal, and the delay circuit 51e is set to a delay time Tτ, which extends from the moment the transmit signal x(t) is input to the distortion compensator 51 to the moment the feedback signal y(t) is input to the distortion compensation coefficient calculation unit 51c, and delays the transmit signal x(t) by this delay time. The FFT unit 51f extracts each frequency-signal component of the feedback signal y(t) and inputs the components to the monitoring control circuit 51g. The latter includes a delay-time controller 51g-1 for setting and adjusting the delay time Tτ so as to diminish distortion-component power, and a coefficient-update suspension controller 51g-2 for exercising control so as to suspend processing for updating distortion compensation coefficients by the distortion compensation coefficient updater 51c when the level of an unwanted-wave signal, which penetrates the apparatus from space via an antenna 57, is greater than a set level, and resume processing for updating distortion compensation coefficients if the level of the unwanted-wave signal is equal to or less than the set level.

The transmit signal x(t) of the baseband is input to the distortion compensator 51 in the form of, e.g., I, Q orthogonal signals. The power calculation unit 51d of the distortion compensator 51 calculates the power of the entering transmit signal x(t), reads a distortion compensation coefficient h(pi) conforming to power pi (i=0 to 1023) out of the distortion compensation coefficient table 51a and inputs the coefficient to the predistortion unit 51b. The latter executes distortion compensation processing (predistortion) by multiplying the transmit signal x(t) by the distortion compensation coefficient h(pi) conforming to the power level of the transmit signal and outputs the resulting signal.

The signal (actually a complex orthogonal signal) that has been subjected to distortion compensation processing by the distortion compensator 51 is input to a digital modulator (QMOD) 52. The latter applies digital quadrature modulation to the in-phase and quadrature components (I and Q signals) of the signal that has undergone distortion compensation processing, and a DA converter 53 converts the digital quadrature-modulated signal to an analog signal and inputs the analog signal to a frequency converter 54. The latter mixes the quadrature-modulated signal and a local oscillation signal, thereby up-converting the modulated-signal frequency to radio frequency. The radio-frequency signal is input to a high-frequency amplifier 81 of a transmitter 55.

The high-frequency amplifier 81 subjects the input signal to high-frequency amplification. The transmit signal that has undergone high-frequency amplification is input to the antenna 57 from a feeder line 56 via a distributor 82 and circulator 83, and the signal is released into space from the antenna 57. Part of the transmit signal that is output from the high-frequency amplifier 81 is branched by the distributor 82, which comprises a directional coupler, and is attenuated by an attenuator 84 and then fed back to a frequency converter 58. The latter down-converts the radio-frequency signal to a baseband signal and inputs this signal to an AD converter 59. The latter converts the baseband signal to digital data and inputs the digital data to the digital quadrature demodulator (QDEM) 60. The latter subjects the input signal to quadrature demodulation processing, reproduces the baseband signals on the transmitting side and inputs the result as the feedback signal y(t) to the distortion compensation coefficient updater 51c and FFT unit 51f.

The distortion compensation coefficient updater 51c compares the transmit signal x(t), which has been delayed by the delay circuit 51e, with the demodulated signal (feedback signal) y(t) obtained by demodulation in the digital quadrature demodulator (QDEM) 60, calculates distortion compensation coefficients h(pi) based upon an adaptive control algorithm so as to null the difference between the compared signals, and updates old coefficients in the distortion compensation coefficient table 51a by the calculated distortion compensation coefficients.

Figure 12A:
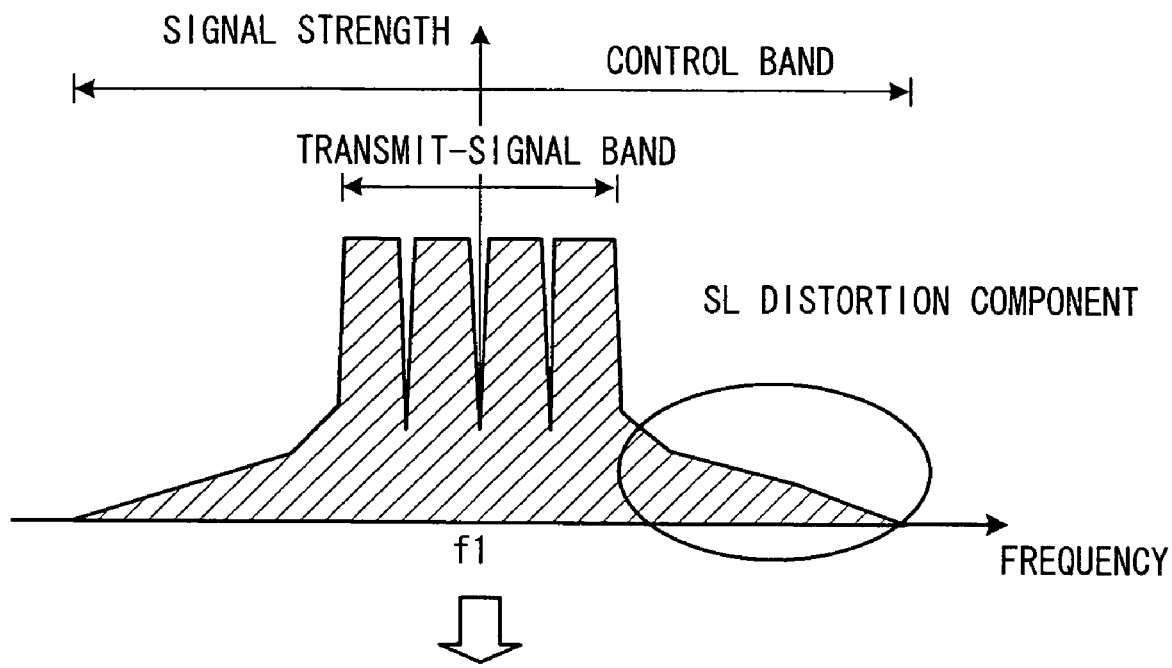
FIGS. 12A and 12B illustrate frequency spectrums in a case where transmit waves are four in number.
Figure 12B:
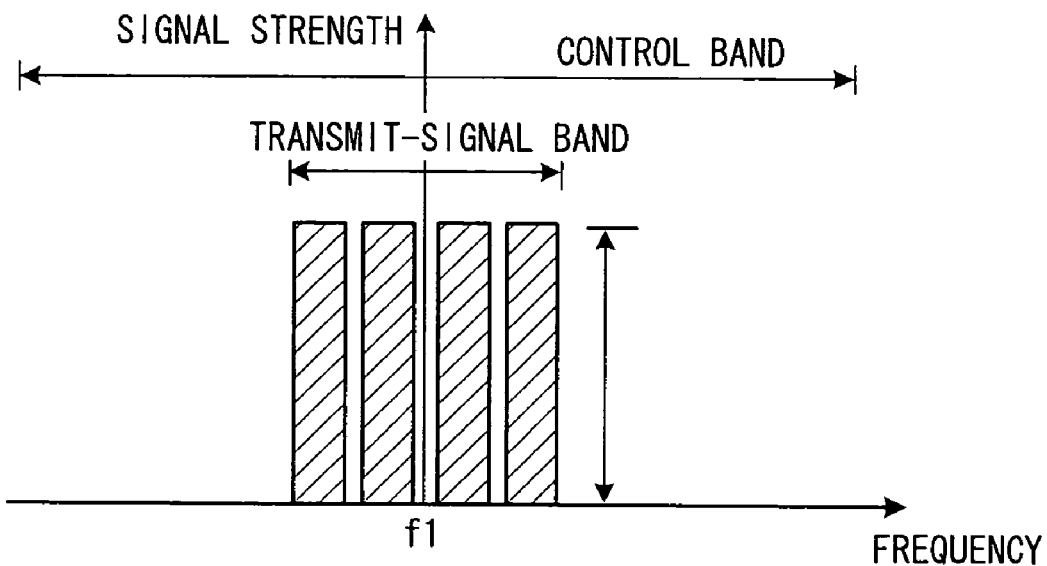
Figure 14:
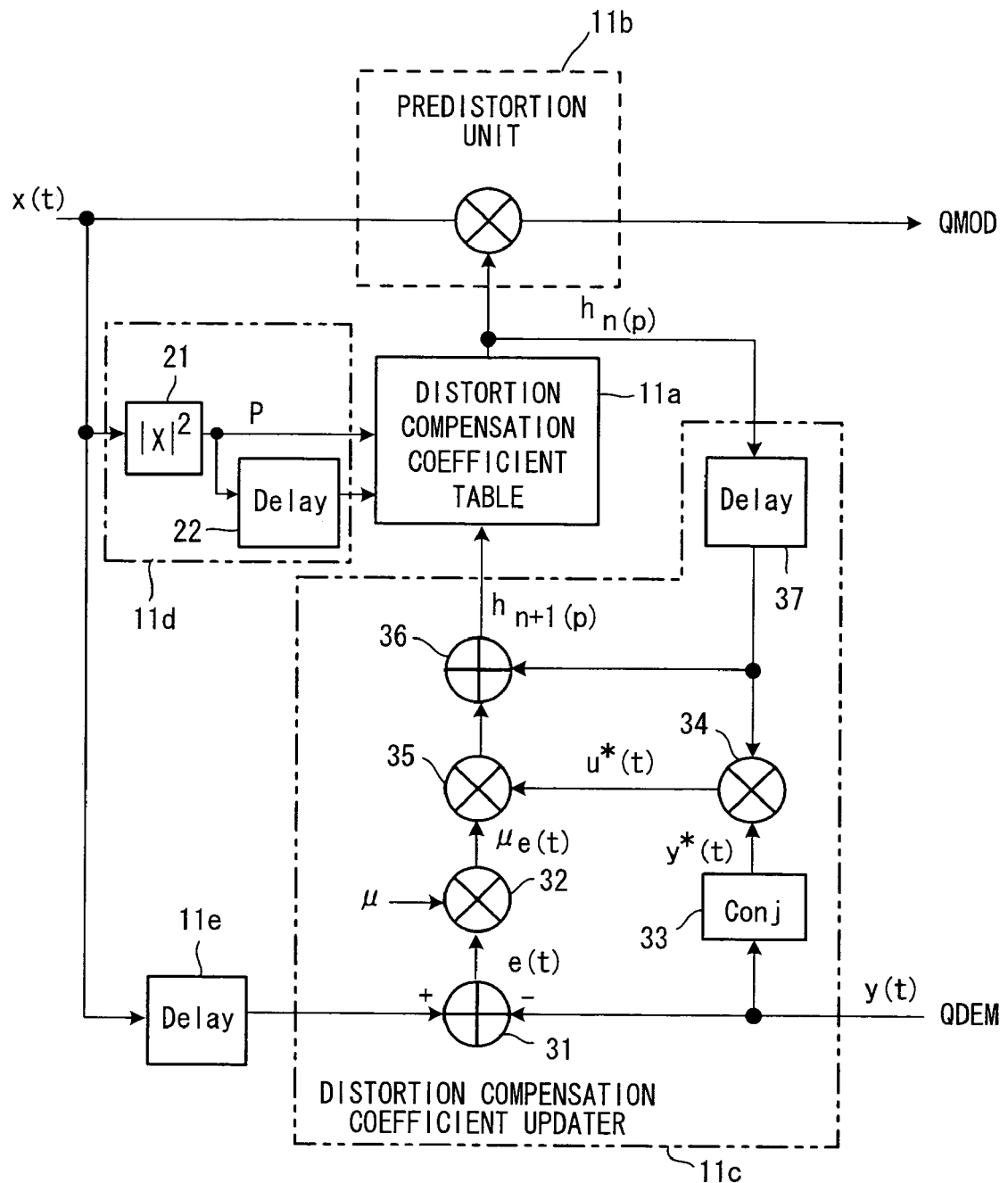
FIG. 14 is a diagram useful in describing processing for updating distortion compensation coefficients according to adaptive LMS.
Figure 15:
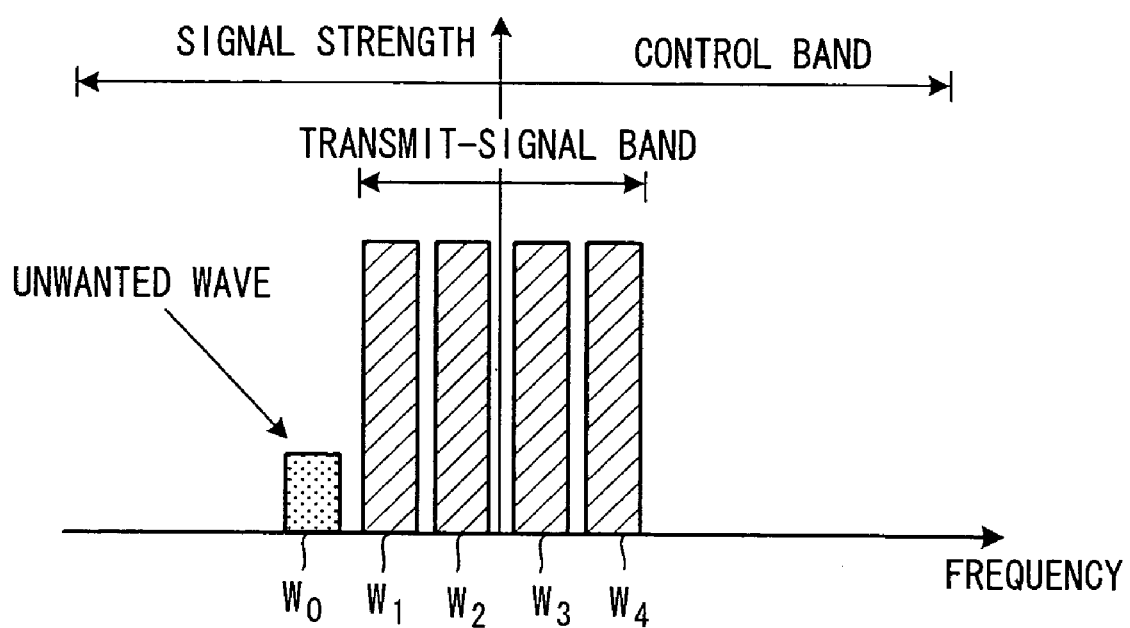
FIG. 15 illustrates a frequency spectrum of an unwanted wave W0 and transmit signals W1 to W4 of four waves.

In parallel with the above operation, the delay-time controller 51g-1 of the monitoring control circuit 51g, on the basis of each frequency signal component extracted by the FFT unit 51f, calculates the ACPR from the power of the transmit signal and the distortion-component power (leakage power) that is outside the band of the transmit-signal power and adjusts the delay time Tτ based upon the ACPR calculated. By subsequently repeating the above operation, non-linear distortion of the high-frequency amplifier 81 in transmitter 55 is suppressed to reduce distortion-component power (leakage of power between adjacent channels), whereby the frequency spectrum becomes as illustrated in FIG. 12B.

Further, an unwanted wave that penetrates the apparatus from space via the antenna 57 reaches an amplifier 85 through the feeder line 56 and circulator 83. The amplifier 85 amplifies the unwanted-wave signal input thereto and a detector 86 detects the unwanted-wave signal, smoothes the signal and inputs the smoothed signal to a comparator 87. The latter compares a reference voltage Vr, which has been set by a reference-voltage setting unit 88, and the level of the unwanted-wave signal and inputs an unwanted-wave power monitoring signal PM, which has a high or low level depending upon the result of the comparison, to the coefficient-update suspension controller 51g-2 of the monitoring control circuit 51g. The coefficient-update suspension controller 51g-2 exercises control so as to halt processing for updating the distortion compensation coefficients by the distortion compensation coefficient updater 51c when the level of the unwanted-wave signal is above a set level (i.e., when the unwanted-wave power monitoring signal PM is at the high level), and continue or resume processing for updating distortion compensation coefficients if the level of the unwanted-wave signal is below the set level (i.e., if the unwanted-wave power monitoring signal PM is at the low level).

More specifically, adjustment of the delay time Tτ by the delay-time controller 51g-1 is performed as follows: The FFT unit 51f accumulates digital data (data at sampling times $t_0$ to $t_{1023}$) of N (=1024) points output from the digital quadrature demodulator 60 and implements a fast-Fourier transform. By virtue of the FFT operation, N/2 (=512) spectrums are obtained at intervals of a frequency Δf (=1/Δt·N), where Δt represents the sampling period Δt. The monitoring control circuit 51g calculates ACPR using the spectrums output from the FFT unit 51f. That is, the monitoring control circuit 51g totalizes the spectrums belonging to the band of the frequency channel of the transmit signal to calculate signal-component power Ps, and totalizes the spectrums outside the band to calculate distortion-component power Pd. Next, the monitoring control circuit 51g calculates the ACPR at time t using the following equation:

$$ACPR = Pd/Ps \qquad (1)$$

Next, the delay-time controller 51g-1 compares the presently prevailing ACPR and the stored previous ACPR and increases or decreases the delay time Tτ based upon the result of the comparison. By way of example, the controller 51g-1 changes (increases or decreases) the delay time in the same direction as previously if the ACPR decreases and changes the time delay in the direction opposite the previous direction if the ACPR increases. Processing for adjusting the delay time is thenceforth repeated to decide the accurate delay time Tτ and set it in the delay circuit 51e.

Figure 2:
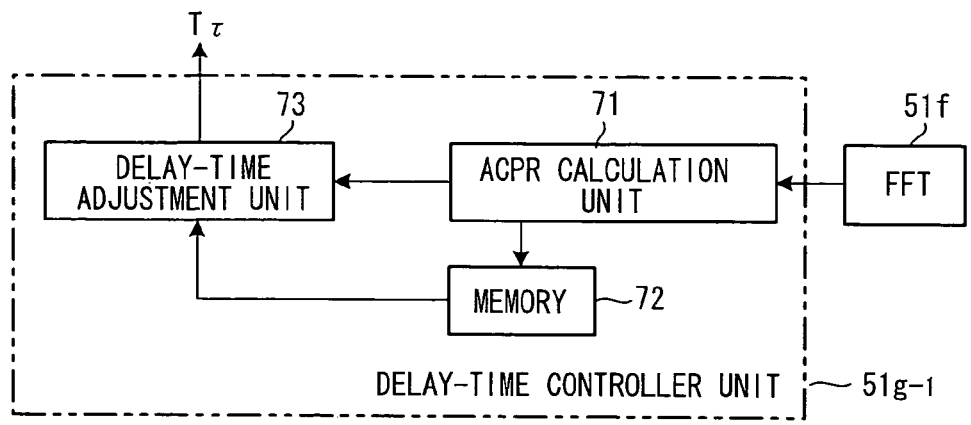
FIG. 2 is a block diagram of a delay time controller.

FIG. 2 illustrates an example of the structure of the delay-time controller 51g-1, which includes an ACPR calculation unit 71 for calculating ACPR in accordance with Equation (1), a memory 72 for storing the ACPR calculated, and delay-time adjustment unit 73 for adjusting the delay time.

Figure 3:
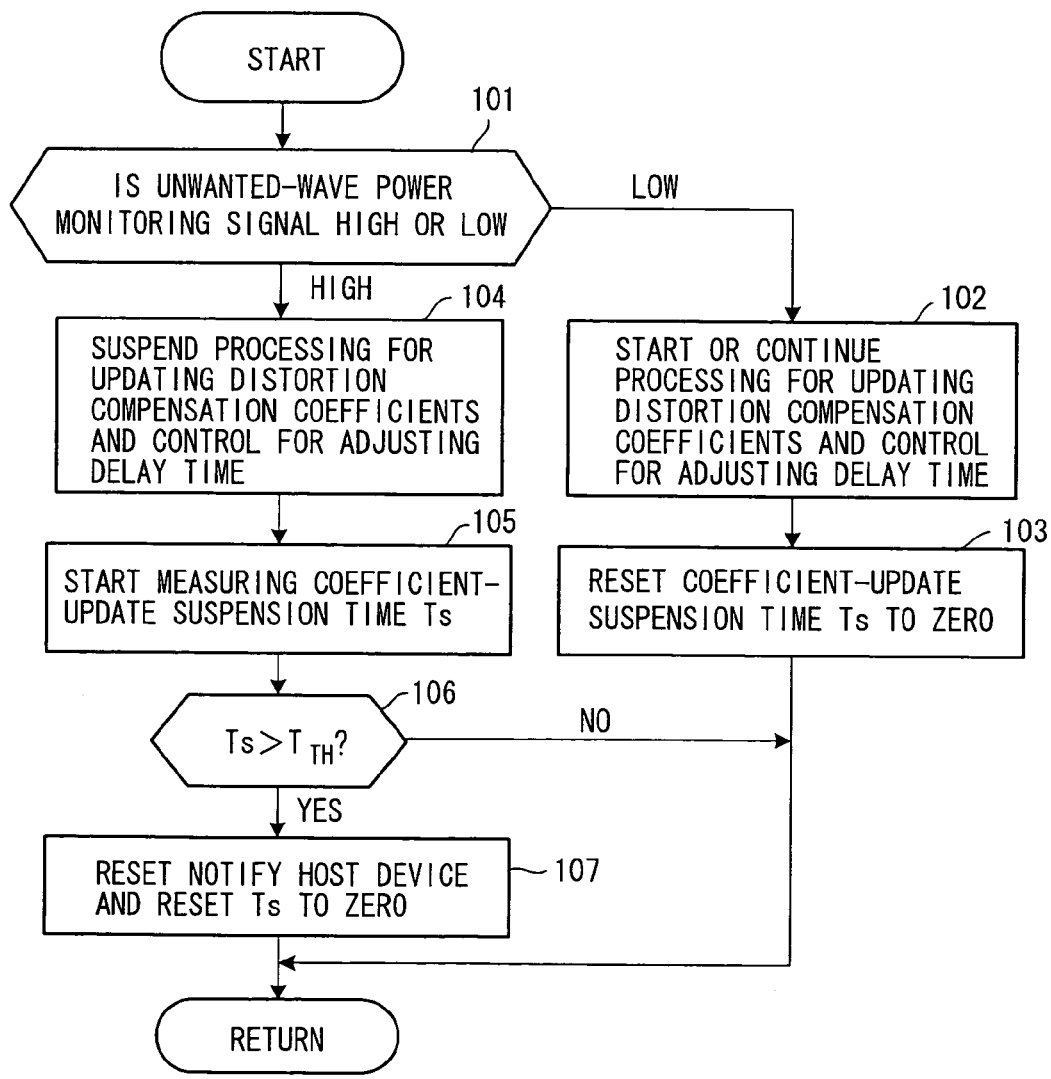
FIG. 3 is a flowchart of control processing executed by a coefficient-update suspension controller.

FIG. 3 is a flowchart illustrating control processing executed by the coefficient-update suspension controller 51g-2. Whether the high-level unwanted-wave power monitoring signal PM, which indicates that the power (or amplitude) of an unwanted wave that has penetrated the apparatus from space via the antenna is greater than a set level, has been received is investigated by the unwanted-wave monitor (comparator 87) (step 101). If the unwanted-wave power monitoring signal PM is at the low level, thereby indicating that the power of the unwanted wave is below the set level, then the coefficient-update suspension controller 51g-2 causes the distortion compensation coefficient updater 51c to continue or start (resume) processing for updating distortion compensation coefficients and further causes the delay-time controller 51g-1 to continue or start (resume) control for adjusting the delay time (step 102). Next, the coefficient-update suspension controller 51g-2 resets to zero (step 103) a time Ts during which coefficient updating is suspended. Control then returns to the beginning and processing is repeated from start.

On the other hand, if the unwanted-wave power monitoring signal PM is at the high level, thereby indicating that the power of the unwanted wave is above the set level, then the coefficient-update suspension controller 51g-2 causes the distortion compensation coefficient updater 51c to suspend processing for updating distortion compensation coefficients and causes the delay-time controller 51g-1 to suspend control for adjusting delay time (step 104). Next, the coefficient-update suspension controller 51g-2 starts measuring the time Ts (step 105) and checks to determine whether the time Ts has exceeded a set time $T_{TH}$ (step 106). If Ts has not exceeded $T_{TH}$, then control returns to the beginning and processing is repeated from start. On the other hand, if Ts>$T_{TH}$ holds, then the host device is notified of the fact that coefficient updating has ceased for longer than the set time, Ts is reset to zero (step 107) and control then returns to the beginning, whence processing is repeated.

If the host device has received the above-mentioned notification, the host device recognizes that distortion compensation is not being performed normally and takes measures such as switching over to another distortion compensating amplifier.

Thus, in accordance with the distortion compensating amplifier of the first embodiment, the distortion compensation coefficient table is not updated if an unwanted wave that exceeds a set level has entered from the antenna. As a result, the distortion compensation coefficient table can be prevented from being shifted from optimum values. Furthermore, since there is no change in conditions such as a sudden change in temperature, it is possible to perform correct distortion compensation even if the distortion compensation coefficient table is not updated for a comparatively long period of time.

Further, if coefficient updating is halted for a period longer than a set period of time, this is reported to a host device so that prescribed measures can be taken.

(C) Second Embodiment

Figure 4:
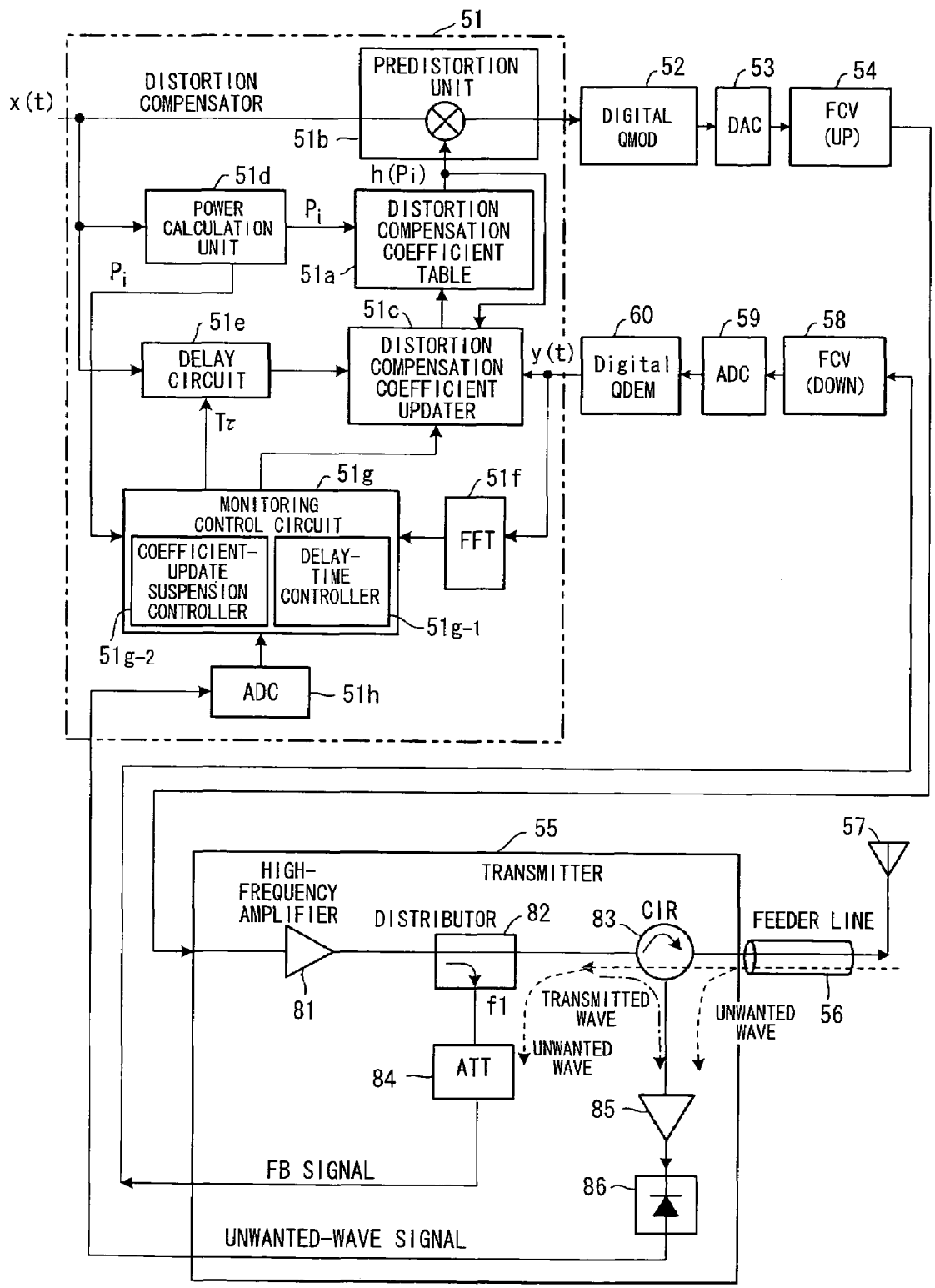
FIG. 4 is a block diagram illustrating a distortion compensating amplifier according to a second embodiment having a digital distortion compensating function.

FIG. 4 is a block diagram illustrating a distortion compensating amplifier according to a second embodiment having a digital distortion compensating function. Components identical with those of the first embodiment shown in FIG. 1 are designated by like reference characters. This embodiment differs in that (1) the comparator 87 and reference-voltage setting unit 88 are deleted from the transmitter 55 and a signal obtained by rectifying the unwanted-wave signal is input to the distortion compensator 51; (2) the distortion compensator 51 is provided with an AD converter 51$h$, whereby the rectified unwanted-wave signal is converted to digital data and the digital data is input to the coefficient-update suspension controller 51$g$-2 of the monitoring control circuit 51$g$; (3) the transmit-signal power pi is input to the coefficient-update suspension controller 51$g$-2; and (4) the coefficient-update suspension controller 51$g$-2 executes control for suspending coefficient updating based upon the power (or amplitude) level of the unwanted-wave signal and the transmit-signal power. Processing for updating distortion compensation coefficients and control for adjusting delay time are the same as those of the first embodiment.

Figure 5:
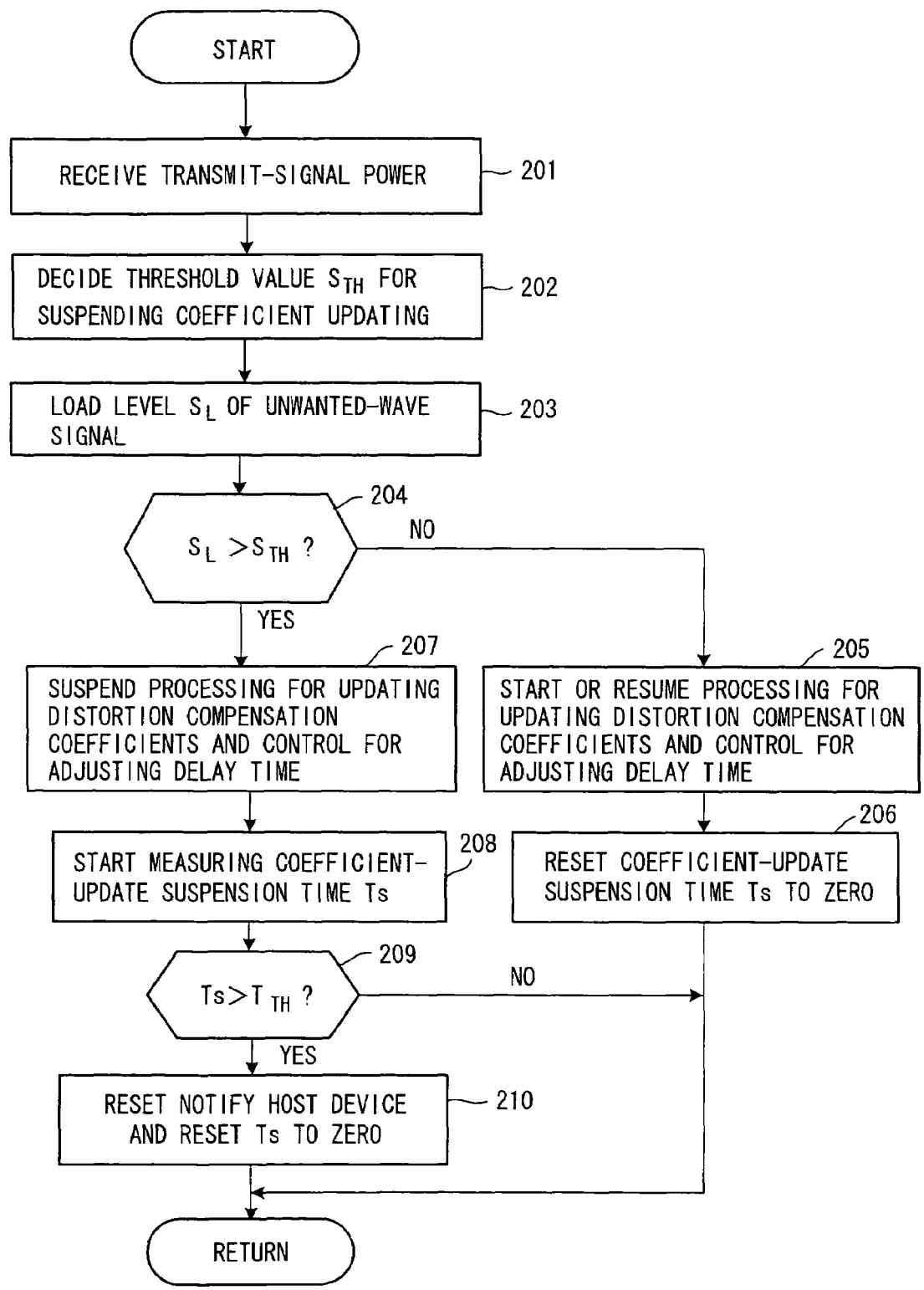
FIG. 5 is a flowchart of control processing executed by a coefficient-update suspension controller according to the second embodiment.

FIG. 5 is a flowchart of control processing by the coefficient-update suspension controller 51$g$-2 according to the second embodiment.

The coefficient-update suspension controller 51$g$-2 first receives the power of the transmit signal from the power calculation unit 51$d$ (step 201) and sets a threshold value $S_{TH}$ for suspending coefficient updating (step 202). By way of example, taking into consideration beforehand the fact that the transmit signal leaks in from the circulator 83 and is superimposed upon the unwanted wave, the coefficient-update suspension controller 51$g$-2 (1) measures the power of the leakage signal in accordance with the power of the transmit signal and (2) stores a signal, which is greater than the measured level by a predetermined level L, in memory as the threshold value $S_{TH}$ for every value of transmit-signal power. The controller 51$g$-2 then reads the threshold value $S_{TH}$ conforming to the transmission power Pi out of the memory and sets the threshold value. It should be noted that the level L may be a fixed value. However, the greater the power of the transmit signal, the larger the level L is made.

Next, the controller 51$g$-2 loads the unwanted-wave signal from the AD converter 51$h$ (step 203) and compares the level $S_L$ of the unwanted-wave signal with the threshold value $S_{TH}$ that corresponds to the level of the transmit signal (step 204). If the level $S_L$ of the unwanted-wave signal is equal to or less than the threshold value $S_{TH}$ ("NO" at step 204), then the coefficient-update suspension controller 51$g$-2 causes the distortion compensation coefficient updater 51$c$ to continue or start (resume) processing for updating distortion compensation coefficients and further causes the delay-time controller 51$g$-1 to continue or resume control for adjusting the delay time (step 205). Next, the coefficient-update suspension controller 51$g$-2 resets to zero (step 206) the time Ts during which coefficient updating is halted. Control then returns to the beginning and processing is repeated from start.

On the other hand, if the level $S_L$ of the unwanted-wave signal is greater than the threshold value $S_{TH}$ ("YES" at step 204), then the coefficient-update suspension controller 51$g$-2 instructs the distortion compensation coefficient updater 51$c$ to suspend processing for updating distortion compensation coefficients and causes the delay-time controller 51$g$-1 to suspend control for adjusting delay time (step 207). Next, the coefficient-update suspension controller 51$g$-2 starts measuring the time Ts (step 208) and checks to determine whether the time Ts has exceeded the set time $T_{TH}$ (step 209). If Ts has not exceeded $T_{TH}$, then control returns to the beginning and processing is repeated from start. On the other hand, if Ts>$T_{TH}$ holds, the host device is notified of the fact that coefficient updating has ceased for longer than the set time, Ts is reset to zero (step 210) and control then returns to the beginning, whence processing is repeated. If the host device has received the above-mentioned notification, the host device recognizes that distortion compensation is not being performed normally and takes measures such as switching over to another distortion compensating amplifier.

In the description rendered above, the threshold value $S_{TH}$ is decided based upon the power of the transmit signal. However, the threshold value $S_{TH}$ may be a fixed value.

Thus, in accordance with the distortion compensating amplifier of the second embodiment, the distortion compensation coefficient table is not updated if an unwanted wave that exceeds a set level has entered from the antenna. As a result, the distortion compensation coefficient table can be prevented from being shifted from optimum values.

Further, in accordance with the second embodiment, the threshold value can be enlarged if the power of the transmit signal increases. This makes it possible to prevent the updating of distortion compensation coefficients from being suspended owing to a low unwanted-wave signal level.

Further, the distortion compensating amplifier of the second embodiment is such that even if there is leakage of the transmit signal into an unwanted-wave signal, the threshold value is decided taking such leakage into consideration. As a result, control for suspending updating of distortion compensation coefficients can be carried out correctly based upon the unwanted-wave signal.

Further, the distortion compensating amplifier of the second embodiment is such that if coefficient updating is halted in excess of a set period of time, this is reported to a host device and the host device can take prescribed measures.

(D) Third Embodiment

FIG. 6 is a block diagram illustrating a distortion compensating amplifier according to a third embodiment having a digital distortion compensating function. Components identical with those of the first embodiment shown in FIG. 1 are designated by like reference characters. This embodiment differs structurally in that the transmitter 55 is provided with a signal changeover unit 89 so that the high-frequency amplified signal output from the high-frequency amplifier 81 and an unwanted-wave signal output from the amplifier 85 are input to the distortion compensation coefficient updater 51$c$ and FFT unit 51f selectively via the frequency converter 58, AD converter 59 and digital demodulator 60.

Figure 7:
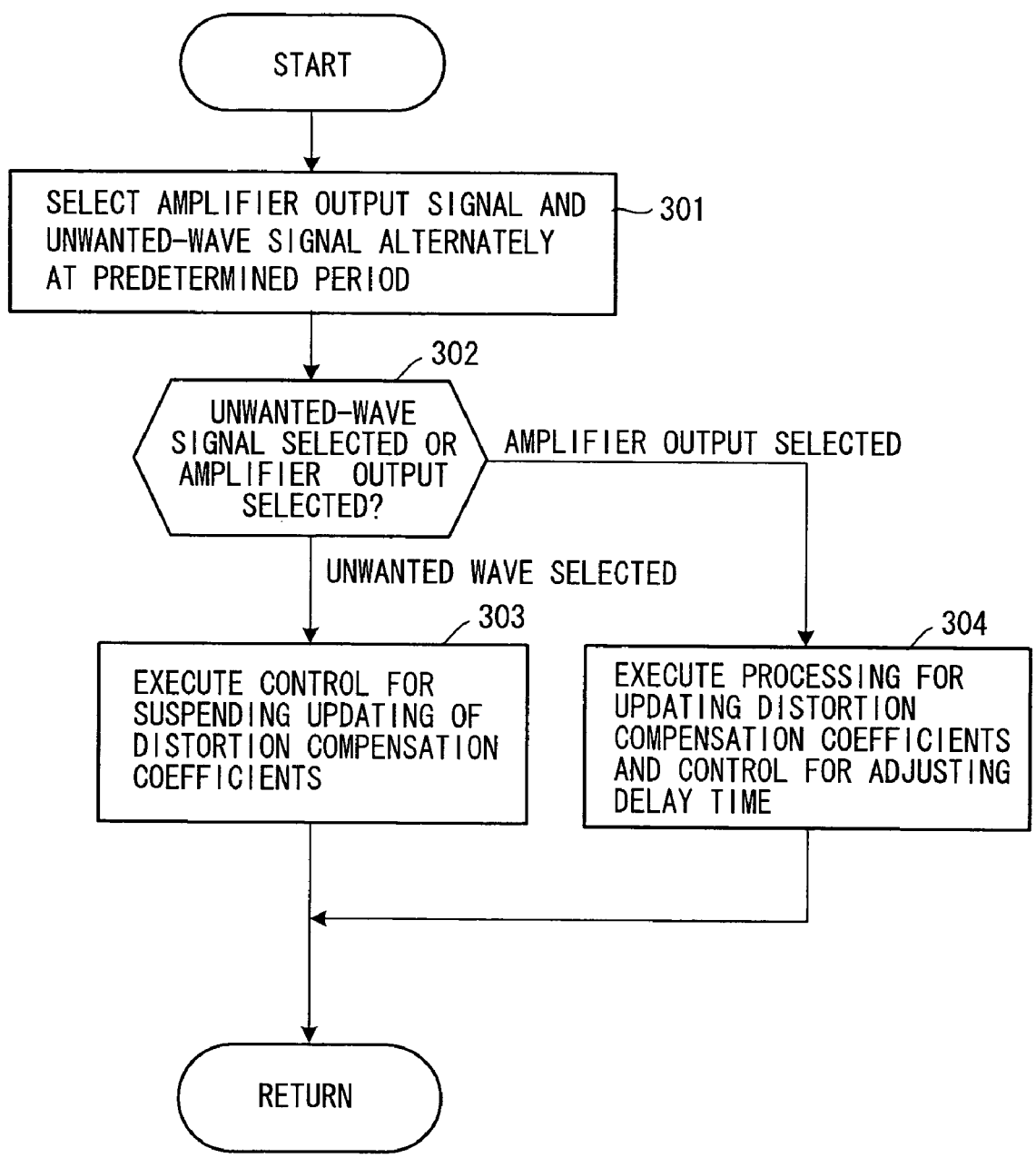
FIG. 7 is a flowchart of control processing executed by a monitoring control circuit according to the third embodiment.

FIG. 7 is a flowchart of control processing by the monitoring control circuit 51g according to the third embodiment.

The monitoring control circuit 51g generates a switch signal SW at a predetermined period, thereby causing the signal changeover unit 89 to alternately select the amplifier output signal or the unwanted-wave signal (step 301).

Next, the monitoring control circuit 51g recognizes whether the unwanted-wave signal or amplifier output signal has been selected (step 302). If the signal changeover unit 89 has selected the unwanted-wave signal, then the coefficient-update suspension controller 51g-2 performs control for suspending coefficient updating, the distortion compensation coefficient updater 51c suspends processing for updating distortion compensation coefficients and the delay-time controller 51g-1 halts control for adjusting the delay time (step 303).

In control for suspending coefficient updating, the coefficient-update suspension controller 51g-2 calculates the power of the unwanted wave outside the band using the signal spectrum of each frequency that is output from the FFT unit 51f, compares the unwanted-wave power and the threshold value $S_{TH}$ and, if the unwanted-wave power is greater than the threshold value $S_{TH}$, instructs the distortion compensation coefficient updater 51c and delay-time controller 51g-1 to halt control for updating the distortion compensation coefficient and control for adjusting delay time. As a result, the distortion compensation coefficient updater 51c and delay-time controller 51g-1 thenceforth halt control for updating the distortion compensation coefficient and control for adjusting delay time until the unwanted-wave power falls below the threshold value $S_{TH}$.

The threshold value $S_{TH}$ is decided as follows: Taking into consideration the fact that the transmit signal leaks in from the circulator 83 and is superimposed upon the unwanted wave, the controller 51g-2 measures the leakage part of distortion-component power in accordance with the power of the transmit signal and stores a value, which is greater than the measured level (the leakage part of the distortion-component power) by a predetermined level L, in memory as the threshold value $S_{TH}$ for every value of transmit-signal power. In this case the level L may be a fixed value. However, the greater the power of the transmit signal, the larger the level L is made.

On the other hand, if the signal changeover unit 89 has selected the amplifier output signal, then the coefficient-update suspension controller 51g-2 suspends control for coefficient updating. Further, if halting of coefficient updating has not been specified by the monitoring control circuit 51g, then the distortion compensation coefficient updater 51c executes processing for updating distortion compensation coefficients and the delay-time controller 51g-1 exercises control for adjusting the delay time (step 304). It should be noted that control of delay time and processing for updating distortion compensation coefficients are similar to such control and processing according to the first embodiment.

Thus, in accordance with the distortion compensating amplifier of the third embodiment, the distortion compensation coefficient table is not updated if an unwanted wave that exceeds a set level has entered from the antenna. As a result, the distortion compensation coefficient table can be prevented from being shifted from optimum values.

Figure 8:
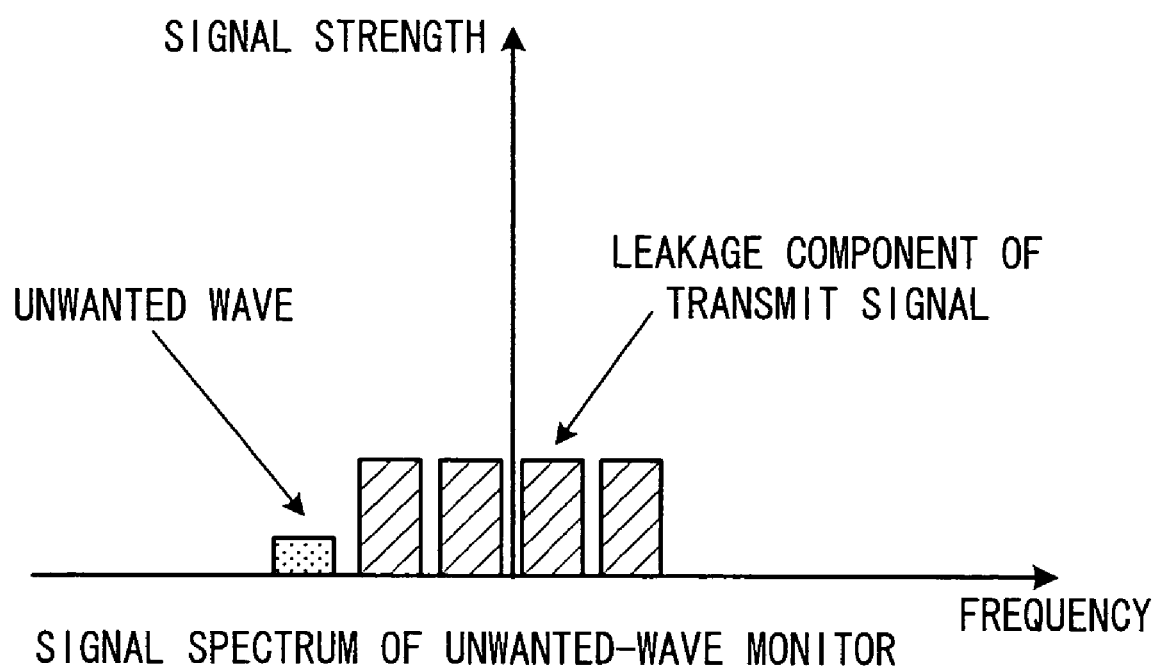
FIG. 8 is a diagram useful in describing the band of a leakage component from a circulator and the band of an unwanted wave.
Figure 10:
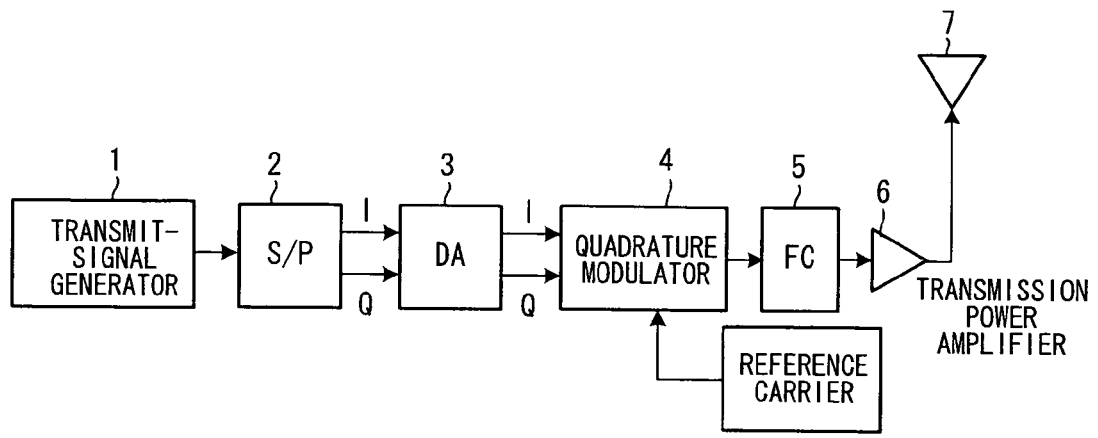
FIG. 10 is a block diagram illustrating an example of a transmitting apparatus in a radio according to the prior art.
Figure 11A:
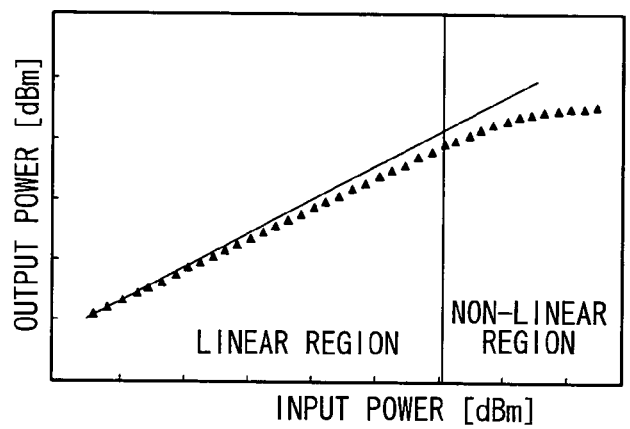
FIGS. 11A and 11B respectively illustrate an input/output characteristic and frequency spectrum in the vicinity of transmission frequency of a transmission power amplifier according to the prior art.
Figure 11B:
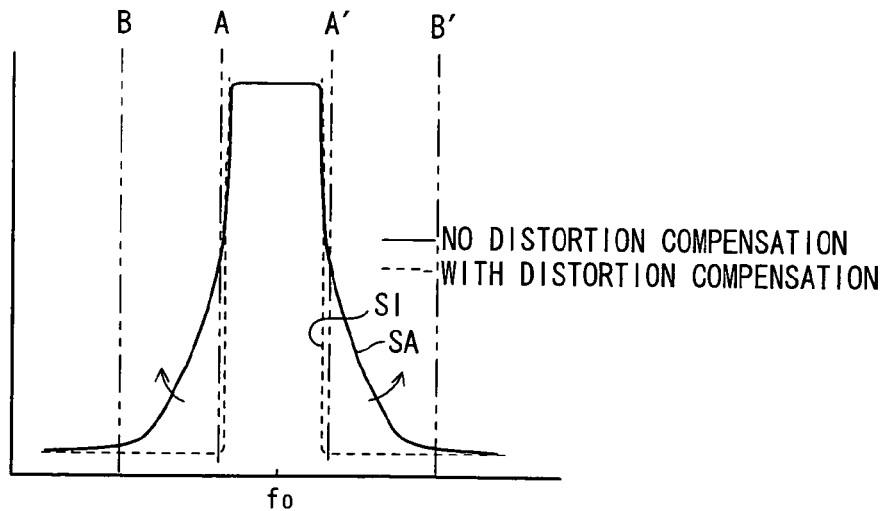

Further, according to the distortion compensating amplifier of the third embodiment, even if a leakage component of a transmit signal enters from the circulator 83 and mixes in with an unwanted wave, as shown in FIG. 8, the unwanted-wave signal outside the band can be measured correctly using frequency information (e.g., signal strength on a per-frequency basis) that is output from the FFT unit 51f. As a result, control for suspending updating of distortion compensation coefficients can be performed accurately based upon the level of the unwanted-wave signal.

Further, according to the distortion compensating amplifier of the third embodiment, the threshold value can be enlarged if the power of the transmit signal increases. This makes it possible to prevent the updating of distortion compensation coefficients from being suspended owing to a low unwanted-wave signal level when the power of the transmit signal is high.

(E) Fourth Embodiment

FIG. 9 is a block diagram illustrating a distortion compensating amplifier according to a fourth embodiment having a digital distortion compensating function. Components identical with those of the third embodiment shown in FIG. 6 are designated by like reference characters. In the third embodiment described above, the frequency converter 58, AD converter 59, digital demodulator 60 and FFT unit 51f are provided in common for both the feedback signal and unwanted-wave signal, and the feedback signal and unwanted-wave signal are alternately input to the FFT unit 51f selectively by the signal changeover unit 89 via the common circuitry. The fourth embodiment differs, however, in that frequency converters 58, 58', AD converter 59, 59', digital demodulators 60, 60' and FFT units 51f, 51f' are provided independently for the feedback signal and unwanted-wave signal, respectively.

The fourth embodiment, besides providing the actions and effects of the third embodiment, is such that the coefficient-update suspension controller 51g-2 performs control for suspending coefficient updating at all times. As a result, coefficient updating can be suspended immediately as soon as an unwanted wave exceeds the threshold value. Further, since control for adjusting delay time and control for updating distortion compensation coefficients is performed at all times, the distortion compensation coefficients can be stabilized rapidly.

As many apparently widely different embodiments of the present invention can be made without departing from the spirit and scope thereof, it is to be understood that the invention is not limited to the specific embodiments thereof except as defined in the appended claims.

What is claimed is:

1. A distortion compensating amplifier having a distortion compensator for compensating for distortion of an amplifier by updating distortion compensation coefficients so as to null a difference between a transmit signal and a feedback signal, and subjecting the transmit signal to distortion compensation processing using the distortion compensation coefficients; an amplifier for amplifying the transmit signal, which has undergone distortion compensation, in order to transmit the signal from an antenna; a feedback unit for inputting an output signal from the amplifier to a distortion compensation coefficient updater in the distortion compensator as the feedback signal; and a delay circuit for inputting the transmit signal to the distortion compensation coefficient updater upon delaying the transmit signal, said distortion compensating amplifier comprising:

means for monitoring whether the level of an unwanted-wave signal that penetrates the amplifier from space via the antenna is greater than a set level; and update processing suspension means for suspending processing for updating the distortion compensation coefficients if the level of the unwanted-wave signal is greater than the set level.

2. The amplifier according to claim 1, further comprising:
means for detecting a signal component, which is outside a frequency band of the transmit signal, included in the feedback signal;
means for controlling delay time of said delay circuit based upon power of the signal component.

3. The amplifier according to claim 1, wherein said update processing suspension means resumes processing for updating the distortion compensation coefficients if the level of the unwanted-wave signal is less the set level.

* * * * *